United States Patent
Holbrook (10) Patent No.: US 7,391,721 B1
(45) Date of Patent: Jun. 24, 2008

(54) MAINTAINING COUNTERS AND UPDATING A SECONDARY COUNTER STORAGE

(75) Inventor: Hugh Weber Holbrook, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 973 days.

(21) Appl. No.: 10/888,643

(22) Filed: Jul. 8, 2004

(51) Int. Cl.
    *H04J 1/16* (2006.01)
(52) U.S. Cl. .................................................. 370/229
(58) Field of Classification Search ............... 370/229; 377/44
    See application file for complete search history.

(56) References Cited

U.S. PATENT DOCUMENTS

| | | | |
|---|---|---|---|
| 4,733,390 | A | 3/1988 | Shirakawa et al. |
| 5,463,620 | A | 10/1995 | Sriram |
| 5,953,338 | A | 9/1999 | Ma et al. |
| 6,067,301 | A | 5/2000 | Aatresh |
| 6,678,248 | B1 | 1/2004 | Haddock et al. |
| 6,690,646 | B1 * | 2/2004 | Fichou et al. ............ 370/231 |
| 6,856,257 | B1 | 2/2005 | Van Heteren |
| 6,956,866 | B1 | 10/2005 | Li et al. |
| 7,304,942 | B1 * | 12/2007 | Malladi et al. ............ 370/229 |
| 2005/0022017 | A1 * | 1/2005 | Maufer et al. ............ 713/201 |

FOREIGN PATENT DOCUMENTS

JP         2003069629 A  *  3/2003

OTHER PUBLICATIONS

Shah et al., "Maintaining Statistics Counters in Router Line Cards," IEEE Micro, pp. 76-81, Jan.-Feb. 2002.

* cited by examiner

*Primary Examiner*—Hassan Kizou
*Assistant Examiner*—Betty Lee
(74) *Attorney, Agent, or Firm*—The Law Office of Kirk D. Williams (57) ABSTRACT

Disclosed are, inter alia, methods, apparatus, data structures, computer-readable media, and mechanisms for maintaining counters, such as in, but not limited to a packet switching system, and updating a secondary counter storage based on values of the counters and entries in an overflow buffer. Multiple counter values are stored in a counter bank. An indication of a particular counter of the multiple counters to update is received. A current value of the particular counter is updated in the counter bank, and if an overflow condition results, then an indication of the particular counter is added to an overflow buffer. Periodically each of the multiple counters are visited and corresponding values are updated in a secondary storage, and each entry is retrieved from the overflow buffer and a corresponding value is updated in the secondary storage.

27 Claims, 11 Drawing Sheets

MAINTAINING COUNTERS AND UPDATING A SECONDARY COUNTER STORAGE

TECHNICAL FIELD

This invention especially relates to communications and computer systems; and more particularly, the invention relates to maintaining counters, such as in, but not limited to a packet switching system, and updating a secondary counter storage based on values of the counters and entries in an overflow buffer.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP). Note, nothing described or referenced in this document is admitted as prior art to this application unless explicitly so stated.

For example, in networking devices, it is important to maintain accurate packet and byte count counters for all traffic flowing through the device. Such counters are important for customers, for lab testing, and also for verification and debug purposes. Generally, counters must be maintained for a large number of items in a few different categories (e.g., individual routes the packets are taking, the adjacencies/next hops of the packets, etc.). It is not unusual for a network device to need to maintain counters on packets arriving at a rate of fifty million packets per second, and to have to support one million routes (e.g., one million different sets of packet and byte counters in the route category).

Many communications and computer systems keep large numbers of counters to indicate that certain events have occurred. Examples might include packets forwarded, bytes forwarded, overrate bytes, underrate bytes, etc. Externally-visible counters (e.g., those available to the system which are typically accumulated values from the counter bank counters maintained inside components, for example) typically must maintain total event counts that last for days, weeks, or even years. One frequent choice for packet processing applications is to use 64-bit externally-visible counters that are large enough to ensure that they will never wrap. These counters are typically stored in system RAM (usually DRAM or SDRAM). A corresponding counter is typically implemented in hardware and is usually much smaller than sixty-four bits, because typical special-purpose counter resources in the components are more expensive, and hence more limited than commodity system memory. In order to provide the external view of a large counter, the system software periodically reads each counter from the hardware device, adding the value read to an externally-visible counter that is stored in (cheap) system RAM.

The bit-width of the byte and packet counters in hardware are typically chosen such that, in the worst case, all counters can be visited before they overflow, assuming a particular rate at which the counters can be visited. The counter visitation rate is typically a system-dependent constant, and is typically limited by the total fraction of CPU time (or bus bandwidth in some cases) that is allocated to reading counters (and instead of performing other duties). For example, in a device with 100,000 counters, if the CPU is limited to reading 10,000 counters per second, then the counters must be sized such that they have capacity to handle ten seconds worth of traffic. In some systems, CPU performance may limit the rate that the counters can be read; while in other systems, the limitation might be bus bandwidth.

In implementations with the counter bank counters implemented on an application-specific integrated circuit (ASIC), it is not uncommon for the counter state to total many megabits of on-chip memory, occupying a non-trivial fraction of the total chip area. For example, one packet switch uses roughly 150,000 on-chip packet and byte counters with each counter having thirty-two bits of on-chip storage totally 4.8 megabits of on-chip storage. Therefore, it is valuable if the on-chip storage required can be reduced while still ensuring that counters presented to the user do not wrap, and while not increasing CPU burden or bus bandwidth utilization required to read them periodically.

An issue in maintaining these counters is providing the necessary combination of storage space and bandwidth in a fashion that is cost effective, low in power, and low in pin count. Complicating the bandwidth issue is that, as the number of counters grows, the frequency at which software can reasonably read an individual counter lessens. The size and number of counters make storing the full counters directly on a packet switching chip expensive with today's technologies.

Previous solutions to the counter storage problem have addressed the cost of storage by moving the counters off-chip. This necessitates the use of expensive, high-bandwidth RAM (high-speed DDR or QDR SRAMs or DDR SDRAM) that can keep up with the worst-case counter-update bandwidth requirements. If the packet arrival rate is fifty million packets per second, then the counter-update rate (for one type of counter) is fifty million counter updates per second in the worst case.

At a peak rate of fifty million counter updates per second, and using 128 bits to store both the byte and packet counters for one item, the bandwidth required for counter updates (which must read the old counter value and then write back an updated value) is approximately 12.8 gigabits per second. This data bandwidth could be achieved by a 64-bit wide Reduced Latency Dynamic Random Access Memory (RLDRAM) at 200 MHz, with appropriate attention to pipelining and bank conflicts. But this would only support one category of counter, and typical implementations have dozens of categories to maintain. As can be seen, the cost (in terms of board space, power budget, and dollars) of implementing this large a number of counters off-chip at the necessary throughput rate can be unacceptably high.

Some solutions to this problem have used FIFOs to compensate for reduced bandwidth and/or CPU activity (which can delay counter updates). These solutions have generally just used the FIFO as a buffer—the off-chip RAM is still designed for the worst-case bandwidth. (Typically, such FIFOs can hold no more than a few thousand entries, much smaller than the number of items.)

Another technique that has been used is to build two-level counters, where the least-significant bits (LSBs) and the most-significant bits (MSBs) are maintained separately. This can save bandwidth by only having to reference the MSBs when the LSBs overflow, instead of on every counter update. However, the storage required is not reduced.

Some aspects of the counter update problem are described in the article: Devavrat Shah et al., *Maintaining Statistics Counters in Router Line Cards*, IEEE Micro, Jan.-Feb. 2002, pp. 76-81, which is hereby incorporated by reference. Shah et al. describe a theoretical approach, and a largest-counter-first counter management algorithm (LCF CMA) that selects a counter with the largest count to update to a secondary memory. This requires that some mechanism be employed to maintain counters in a sorted order or to quickly determine the largest counter. While this is a theoretically interesting approach, it is not generally practical to implement in current systems because of the cost of the sorting function. Shah et al. admit that their "LCF CMA is a complex algorithm that is hard to implement at a very high speed. It would be interesting to obtain a similar performance as LCF CMA with a less complex algorithm." Id. at 80-81.

SUMMARY

Disclosed are, inter alia, methods, apparatus, data structures, computer-readable media, and mechanisms for maintaining counters, such as in, but not limited to a packet switching system, and updating a secondary counter storage based on values of the counters and entries in an overflow buffer.

One embodiment includes a bank of multiple counters; an overflow buffer configured to store overflow indications corresponding to the counters; a counter update mechanism configured to update counters based on input values, and if updating a counter generates an overflow condition, adding an entry to the overflow buffer to identify the counter; a secondary storage for maintaining secondary counter values corresponding to multiple counters; and a secondary storage update mechanism configured to update the secondary counter values in the secondary storage. The updating of the secondary counter values typically includes: (a) for each particular counter of the multiple counters, reading and resetting a current value of the particular counter and adding its current value, at least when non-zero, to a corresponding secondary counter value in the secondary storage; and (b) for each particular entry of at least a subset of entries currently stored in the overflow buffer if the overflow buffer is not empty, retrieving the particular entry from the overflow buffer and adding a value corresponding to the overflow condition corresponding to the particular entry to a corresponding secondary counter value in the secondary storage. In one embodiment, each of the entries in the overflow buffer includes an index into the bank of the counters to identify the corresponding counter.

One embodiment maintains counters, which typically includes: updating a current value of a particular counter of multiple counters maintained in a counter bank in response to an identification of the particular counter, and if an overflow condition results, then adding an indication corresponding to the particular counter to an overflow buffer; and updating values in a secondary storage, the values corresponding to the multiple counters. The updating of the values in the secondary storage typically includes: (a) visiting each of the counters to update corresponding values in the secondary storage, and (b) retrieving one or more indications from the overflow buffer if it is not empty and updating corresponding values in the secondary storage based on the retrieved indications. In one embodiment, visiting each of the multiple counters to update corresponding values in the secondary storage includes reading and resetting each of the multiple counters. In one embodiment, updating corresponding values in the secondary storage based on retrieved entries includes adding an overflow value corresponding to the overflow condition to said corresponding values in the secondary storage.

In one embodiment, updating values in the secondary storage includes repeatedly performing iterations of the (a) operations and the (b) operations. In one embodiment, each iteration includes an equal number of times that the (a) operations are performed and the (b) operations are performed. In one embodiment, each iteration includes the (b) operations being performed more times than that of the (a) operations. In one embodiment, said (a) is accomplished by operating on different subsets of the multiple counters; and wherein said (b) is performed multiple times during said each iteration, each of said multiple times occurring after said operation on one of said different subsets.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Disclosed are, inter alia, methods, apparatus, data structures, computer-readable media, and mechanisms for maintaining counters, such as in, but not limited to a packet switching system, and updating a secondary counter storage based on values of the counters and entries in an overflow buffer.

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations. Note, computer-readable media and means for performing methods and processing block operations are disclosed and are in keeping with the extensible scope and spirit of the invention.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or direct or indirect identification of a packet or information associated therewith. For example, often times a router operates on one or more fields of a packet, especially the header, so the body of the packet is often stored in a separate memory while the packet header is manipulated, and based on the results of the processing of the packet (i.e., the packet header in this example), the entire packet is forwarded or dropped, etc. Additionally, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process the value—the value must be obtained prior to processing it, although some of the associated processing may be performed prior to, concurrently with, and/or after the read operation). Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications media or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory and storage device. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories"

or "at least one memory", etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. The term "subset" is used to indicate a group of all or less than all of the elements of a set. The term "periodic" is used in a broad manner to refer to having or marked by repeated cycles, happening or appearing at regular intervals, as well as recurring or reappearing from time to time, occasional, intermittent. Moreover, the term "or" is used herein to identify a selection of one or more, including all, of the conjunctive items.

Disclosed are, inter alia, methods, apparatus, data structures, computer-readable media, and mechanisms for maintaining counters, such as in, but not limited to a packet switching system, and updating a secondary counter storage based on values of the counters and entries in an overflow buffer.

One embodiment includes a bank of multiple counters; an overflow buffer configured to store overflow indications corresponding to the counters; a counter update mechanism configured to update counters based on input values, and if updating a counter generates an overflow condition, adding an entry to the overflow buffer to identify the counter; a secondary storage for maintaining secondary counter values corresponding to multiple counters; and a secondary storage update mechanism configured to update the secondary counter values in the secondary storage. The updating of the secondary counter values typically includes: (a) for each particular counter of the multiple counters, reading and resetting a current value of the particular counter and adding its current value, at least when non-zero, to a corresponding secondary counter value in the secondary storage; and (b) for each particular entry of at least a subset of entries currently stored in the overflow buffer if the overflow buffer is not empty, retrieving the particular entry from the overflow buffer and adding a value corresponding to the overflow condition corresponding to the particular entry to a corresponding secondary counter value in the secondary storage. In one embodiment, each of the entries in the overflow buffer includes an index into the bank of the counters to identify the corresponding counter.

One embodiment maintains counters, which typically includes: updating a current value of a particular counter of multiple counters maintained in a counter bank in response to an identification of the particular counter, and if an overflow condition results, then adding an indication corresponding to the particular counter to an overflow buffer; and updating values in a secondary storage, the values corresponding to the multiple counters. The updating of the values in the secondary storage typically includes: (a) visiting each of the counters to update corresponding values in the secondary storage, and (b) retrieving one or more indications from the overflow buffer if it is not empty and updating corresponding values in the secondary storage based on the retrieved indications. In one embodiment, visiting each of the multiple counters to update corresponding values in the secondary storage includes reading and resetting each of the multiple counters. In one embodiment, updating corresponding values in the secondary storage based on retrieved entries includes adding an overflow value corresponding to the overflow condition to said corresponding values in the secondary storage.

In one embodiment, updating values in the secondary storage includes repeatedly performing iterations of the (a) operations and the (b) operations. In one embodiment, each iteration includes an equal number of times that the (a) operations are performed and the (b) operations are performed. In one embodiment, each iteration includes the (b) operations being performed more times than that of the (a) operations. In one embodiment, said (a) is accomplished by operating on different subsets of the multiple counters; and wherein said (b) is performed multiple times during said each iteration, each of said multiple times occurring after said operation on one of said different subsets.

An important property of many of the counters is that they are arranged into "banks". A "bank" of counters is typically defined as, but not limited to a set of counters in which at most C counters in the set can be updated at one time, where C is typically an integer, and is often one or some other small integer. The value of C can be used in determining the sizes of the counters maintained in a bank and the overflow buffer, as well as determining the rate at which the secondary counters must be updated based on the counters maintained in a bank and the overflow indications added to the overflow buffer.

An assumption in a counter bank is that every update might apply to a same counter, and thus affect the rate at which it must be read before it overflows. For example, in one embodiment, counters are maintained for forwarding entries in a table, and each forwarding table entry has packet and byte counters associated with it. A forwarding table entry's byte and packet counters are updated every time a packet is forwarded to that forwarding table entry. In this embodiment, the set of forwarding table entry byte counters form one bank and the set of packet counters form another. However, in one embodiment, these counters are stored in a single counter memory.

In a typical counter bank implementation wherein C equals one, there is one counter per entry in the bank. If the entire counter bank can be scanned by a secondary storage update mechanism in time T, then the counters must be wide enough to ensure that no counter could possibly overflow in time T. This implementation (i.e., without an overflow buffer) is somewhat wasteful of bits, because at most one counter can overflow in time T. The vast majority of the counters will not be anywhere near overflowing. If one counter overflows in time T, then all other counters must have no packets. Generalizing, the critical observation is this: if a single counter in a bank can overflow in time T, then at most two counters can overflow in time 2T, at most four counters in time 4T, and in general at most N counters can overflow in time NT. This fact has a profound implication. By adding an overflow buffer, the total number of bits required in the counter bank can be significantly decreased without reducing the externally-perceived time that it takes the bank (or rather, some counter in the bank) to overflow.

An overflow buffer typically consists of a small, N-entry table associated with the memory. In one embodiment, the overflow buffer is a queue or circular buffer that stores the indices of the last N counters that overflowed.

In one embodiment, when a counter update to a counter in a bank causes it to wrap, (the truncated) new counter value is written back to the counter bank as usual, the index of the overflowing entry is written into the overflow buffer, and the overflow buffer's "next" pointer is advanced (e.g., the index of the counter is enqueued into the overflow buffer). A secondary memory update mechanism is typically responsible for keeping track of which overflow buffer entries it has read and for visiting the overflow buffer fast enough to prevent unread entries from getting overwritten. Note, error processing, such as providing a error notification to a system monitoring process, is performed in one embodiment if the overflow buffer becomes full or overflows.

One embodiment operates as follows. The entire bank is scanned with some period T, and all secondary counters are augmented by a value read from the corresponding hardware counter. Additionally, in that same interval T, the entire overflow buffer is also scanned, and for each new entry in the overflow buffer (i.e., the entries added since the last time the overflow buffer was scanned), the corresponding secondary counter is incremented by an amount equal to its overflow value. For example, if the counter is w bits wide, then the corresponding secondary counter is typically incremented by $2^w$.

Suppose it takes the secondary counter update mechanism time t to read one hardware counter and update the corresponding secondary counter. So, an N-entry counter bank can be completely scanned in time t*N. Now, assume that an B-entry overflow buffer is added to the bank and that it takes time t to process one overflow buffer entry. In time t*(N+B), the entire counter bank and the overflow buffer can be scanned. The values of the hardware counters are only lost if the entire overflow buffer fills up before the secondary counter update mechanism scans it. This can only happen if more than B counters overflow in the time it takes to scan the entire bank and overflow buffer. Alternatively, if the scan interval for the bank and overflow buffer is T seconds, then the addition of a B-entry overflow buffer can reduce the counter memories in the bank by log2 (B) bits without reducing the overflow time.

For example, in one embodiment with a 64k-entry memory that counts packets and bytes, by adding one 16-entry overflow buffer to each of the two counter banks (the packet bank and the byte bank), four bits can be removed from each of the counters without loosing any effective counter capacity. Each table has a 16 bit index, so the number of bits added for the overflow buffers is 2*16*16=512 bits, plus 2*4 bits of pointers. The number of counter bits saved is 64k*4*2=512k bits. A dramatic savings. If instead two 256-entry overflow buffers are used, the amount saved is one megabit minus four kilobits.

For example, if embodiments use only power-of-two overflow buffer sizes, each doubling in the size of the overflow buffer eliminates one more bit from the counter bank without increasing the scan time of the bank. Once the size of the overflow buffer exceeds some value (which can be derived from the bank size), the benefit accrued by shrinking the counter bank is typically offset by the increase in size of the overflow buffer. For example, if the bank has $2^n=N$ entries in it, then each doubling of the overflow buffer's size from B to 2B can eliminate N bits from the counter bank, but this typically requires the size of the overflow buffer to be increased by B*n bits.

Figure 1A:
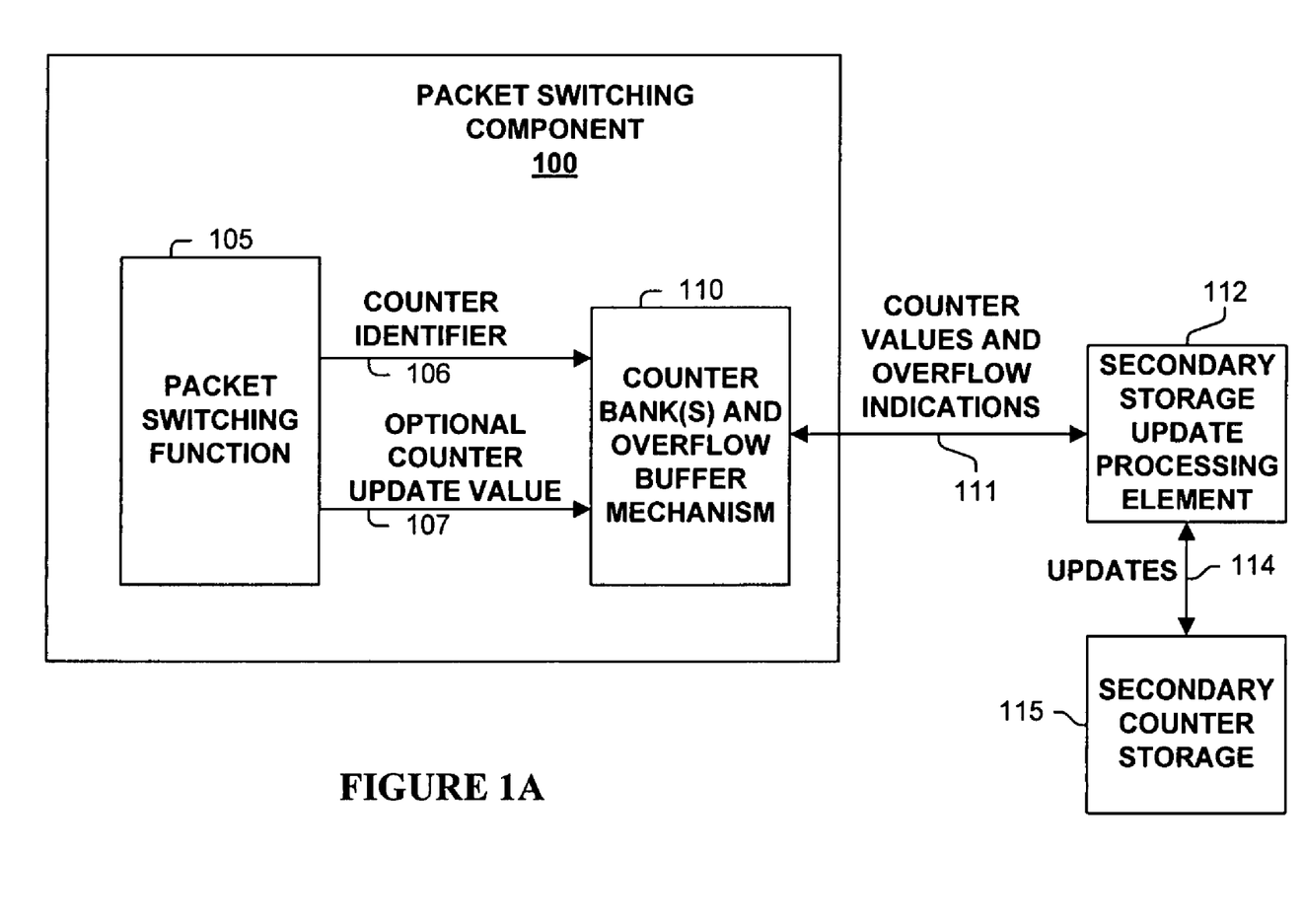
FIG. 1A is a block diagram of a component including the counter banks with an external secondary storage update mechanism and an external secondary counter storage used in one embodiment.

Turning to FIG. 1A, illustrated is an exemplary packet switching component 100 including a counter bank and overflow buffer mechanism 110. In one embodiment, packet switching component is a chip, ASIC, board, or other entity.

As shown, packet switching function 105 generates a counter identifier 106 and optionally a counter update value 107. Counter identifier 106 is used to determine which counter in a bank of counters is to be updated. In one embodiment, counter identifier 106 is an address in the counter bank (e.g., memory or other storage mechanism). Counter update value 107 (e.g., the number of packets, bytes, etc.) is optionally generated. In some contexts, the value to update the counter may be inferred from the particular counter being updated or it might always the be the same (e.g., always update the counter by one or some other value).

Counter bank and overflow buffer mechanism 110 updates its representation of the particular counter in the bank, and if an overflow is generated, then an indication of the counter is added to the overflow buffer.

Periodically, in such a timeframe as to prevent a loss of a counter value, secondary storage update processing element 112 retrieves (111) each of the values in the counter bank and each of the values in the overflow buffer, and updates (114) off-chip secondary counter storage 115 accordingly.

Figure 1B:
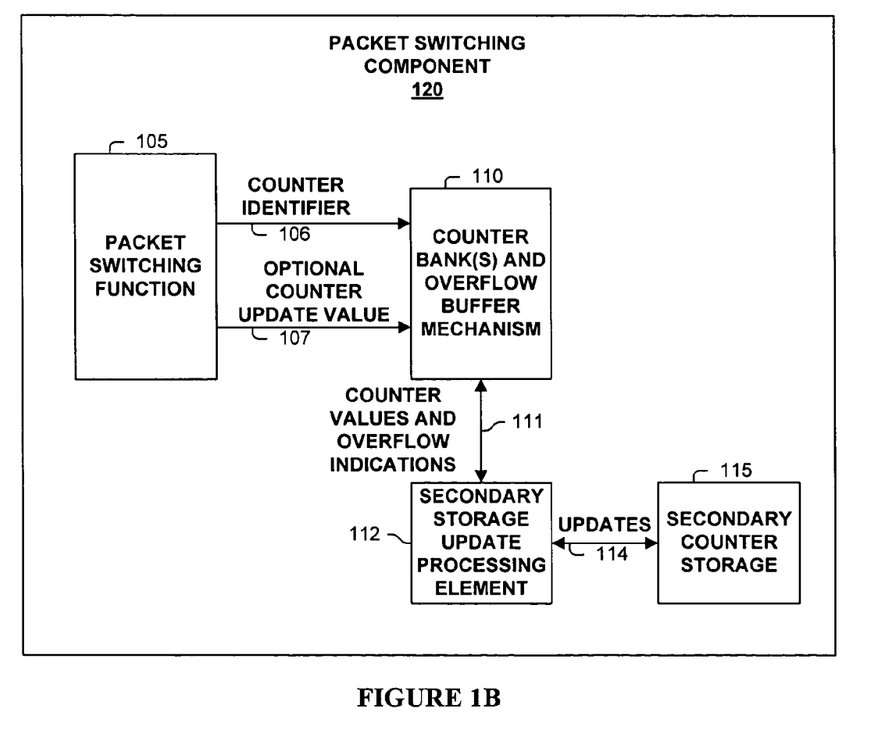
FIG. 1B is a block diagram of a component including the counter banks, the secondary storage update mechanism, and the secondary counter storage used in one embodiment.
Figure 1C:
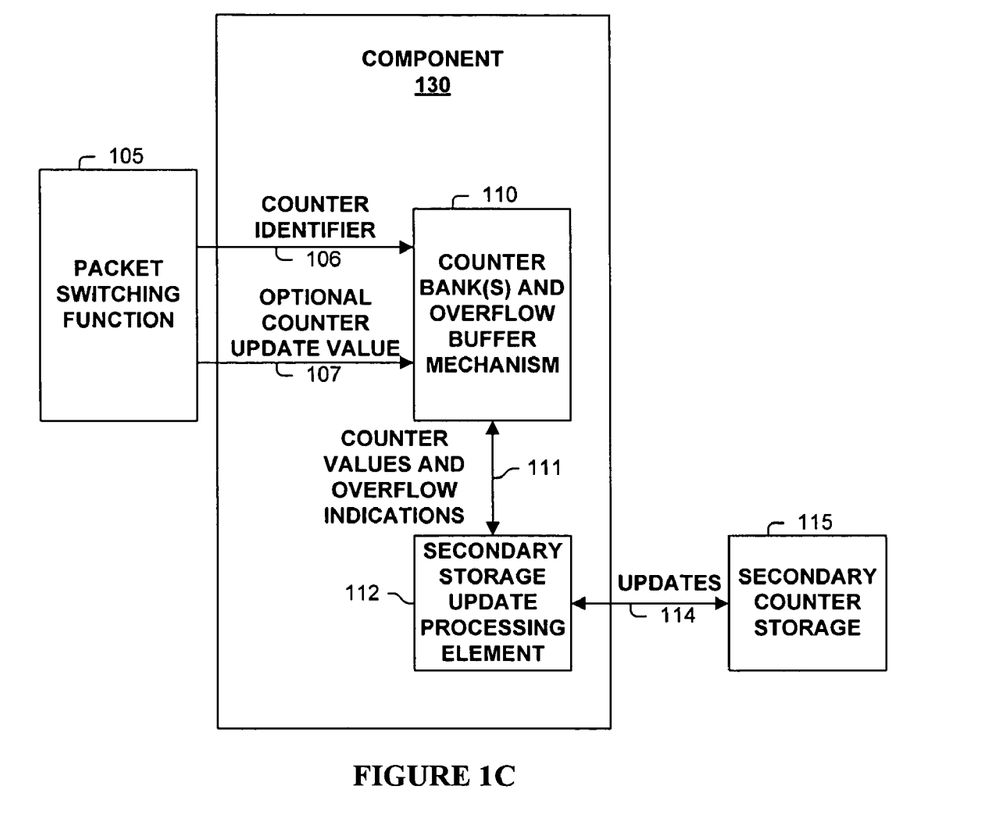
FIG. 1C is a block diagram of a component including the counter banks and the secondary storage update mechanism with an external secondary counter storage used in one embodiment.

Note, embodiments of the invention can be used in an unlimited number of contexts and applications, and the discussion of packet switching is just to illustrate one such application. Moreover, the architecture is not limited to one specific configuration. For example, FIG. 1B illustrates that in one embodiment, exemplary packet switching component 120 may include the counter banks, the secondary storage update mechanism, and the secondary counter storage; and FIG. 1C illustrates that in one embodiment, exemplary packet switching component 130 may include the counter banks and the secondary storage update mechanism, with an external secondary counter storage and an external counter update stimuli (e.g., packet switching function 105).

Figure 2A:
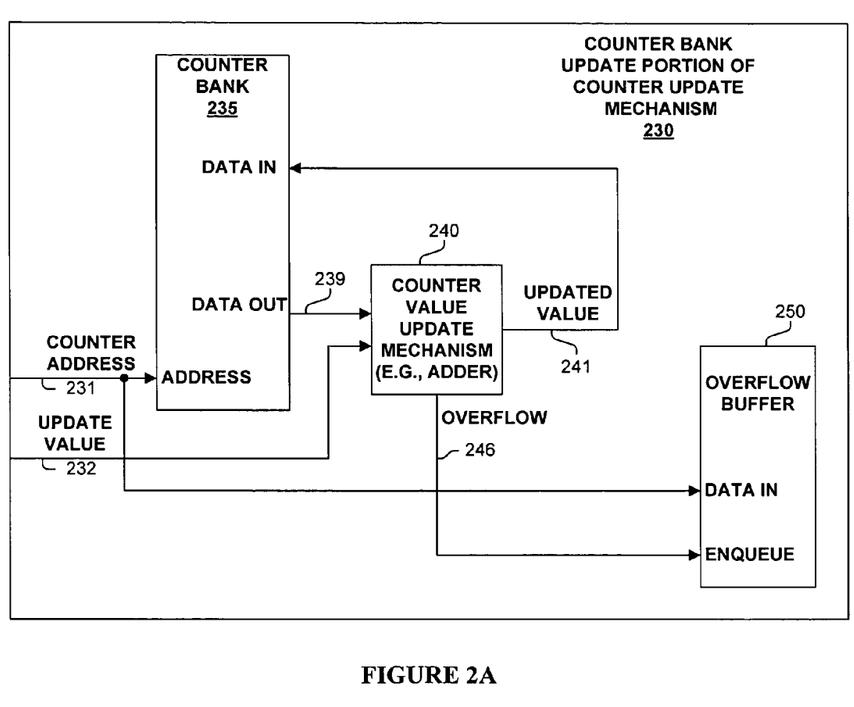
FIGS. 2A-B are block diagrams of aspects of a counter update mechanism used in one embodiment.
Figure 2B:
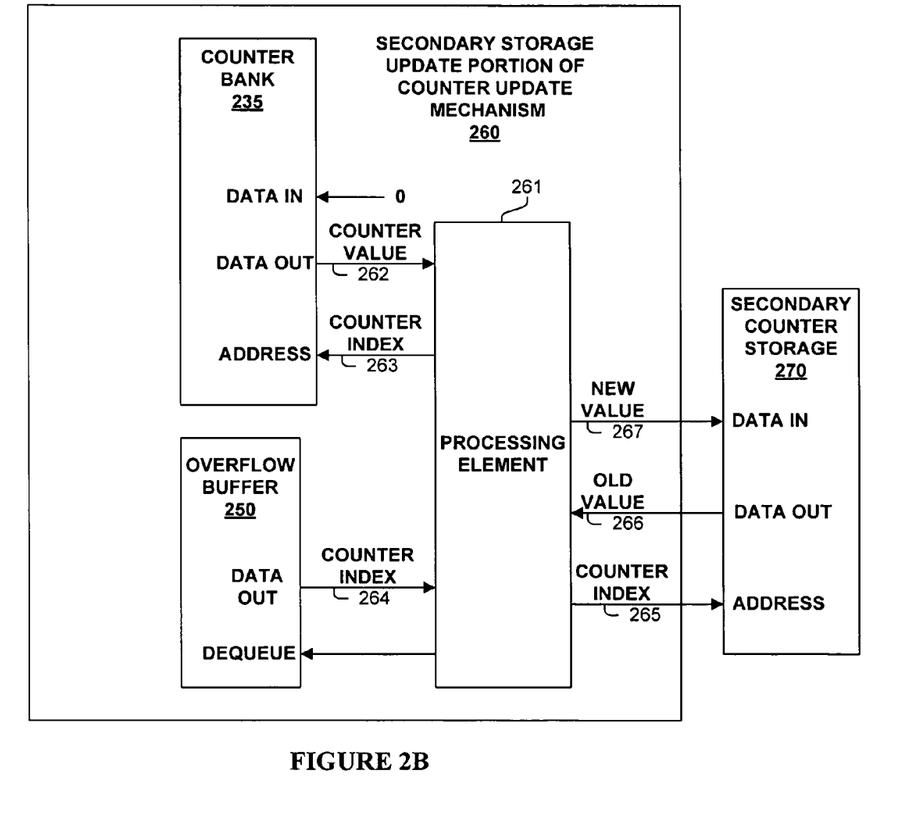

FIGS. 2A-B are block diagrams of aspects 230 and 260 of a counter update mechanism used in one embodiment. Note, these two different views are provided for convenience and ease of understanding, with typically an embodiment performing both functions and thus other connections and connecting elements (e.g., multiplexers, logic gates, etc.) are used to provide both functionality as one skilled in the art would clearly understand.

Shown in FIG. 2A is a portion of an apparatus used by one embodiment to maintain values of counters in counter bank 235 (e.g., a memory, set of hardware counters, etc.), and to update overflow buffer 250 in response to an overflow condition generated during such an update of a counter value. An indication 231 of a counter to be updated is received as well as an update value 232 (which in one embodiment is a constant value of one or some other value, while in one embodiment, it may vary). Counter value update mechanism 240 receives the current value 239 of the counter from counter bank 235 and generates updated value 241 based on update value 232 and current value 239. Updated value 241 is then stored in counter bank 235 as the new value for the counter. If an overflow condition is generated as indicated by signal 246, then the indication of the counter being updated is added to overflow buffer 250.

Shown in FIG. 2B is a secondary storage update portion of counter update mechanism 260 used in one embodiment to periodically update secondary counter storage 270 with current snapshot values of the counters. The current value of a particular counter is its corresponding value stored in counter bank 235 plus an overflow adjustment if there are any corresponding entries in overflow buffer 250 (i.e., an adjustment amount based on one or more corresponding entries in overflow buffer 250).

Periodically, processing element 261 sequences through each of the multiple counters stored in counter bank 235 to retrieve and reset the current value of each counter to an initial value (e.g., typically zero or some other constant) and to update the corresponding counter values maintained in secondary counter storage 270. For example, in one embodiment, processing element 261 will provide a counter index address 263 to counter bank 235 to receive counter value 262 and then to reset the counter's value to zero (e.g., either by writing a zero, using a reset-on-ready memory for counter bank 235, etc.). Processing element 261 then provides counter index 265 (corresponding to the counter retrieved from counter bank 235) to secondary storage to receive old value 266, which is then added to counter value 262 to generate new value 267 which is stored in secondary counter storage 270 at the position indicated by counter index 265.

Processing element 261, as part of this periodic updating of secondary counter storage 270, also retrieves each of the entries in overflow buffer 250 and updates corresponding counters stored in secondary counter storage 270. For example, in one embodiment, processing element receives a counter index 264 from overflow buffer 250. Processing element 261 then provides counter index 265 (corresponding to counter index 264 retrieved from counter overflow buffer 250) to secondary storage to receive old value 266, to which an appropriate overflow value (e.g., two raised to nth power, where n is the number of bits in a counter in counter bank 235) is added generate new value 267, which is stored in secondary counter storage 270 at the position indicated by counter index 265.

Figure 3:
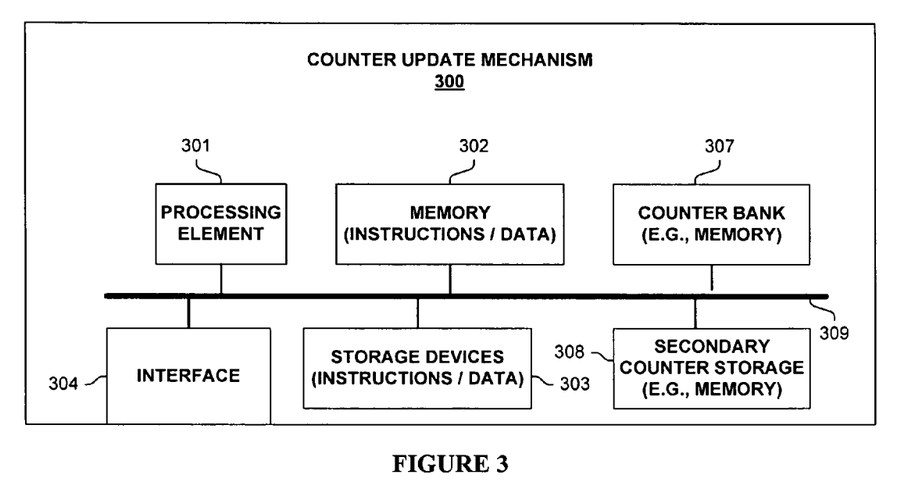
FIG. 3 is a block diagram of a counter update mechanism used in one embodiment.

FIG. 3 is a block diagram of a counter update mechanism 300 used in one embodiment for maintaining counters and updating a secondary counter storage based on values of the counters and entries in an overflow buffer, such as in, but not limited to a packet switching system. In one embodiment, counter update mechanism 300 performs one or more processes corresponding to one or more of the flow diagrams illustrated or otherwise described herein.

In one embodiment, counter update mechanism 300 includes a processing element 301, memory 302, storage devices 303, counter bank 307, secondary counter storage 308, and interface 304 for receiving counter update requests and for communicating stored counter values with other entities and for sending and receiving information/data items and/or communicating with external devices (e.g. processors, packet processors, computers, etc.), which are typically coupled via one or more communications mechanisms 309, with the communications paths typically tailored to meet the needs of the application. Various embodiments of counter update mechanism 300 may include more or less elements. The operation of counter update mechanism 300 is typically controlled by processing element 301 using memory 302 and storage devices 303 to perform one or more tasks or processes. Memory 302 is one type of computer-readable medium, and typically comprises random access memory (RAM), read only memory (ROM), flash memory, integrated circuits, and/or other memory components. Memory 302 typically stores computer-executable instructions to be executed by processing element 301 and/or data which is manipulated by processing element 301 for implementing functionality in accordance with an embodiment. Storage devices 303 are another type of computer-readable medium, and typically comprise solid state storage media, disk drives, diskettes, networked services, tape drives, and other storage devices. Storage devices 303 typically store computer-executable instructions to be executed by processing element 301 and/or data which is manipulated by processing element 301 for implementing functionality in accordance with an embodiment.

Figure 4:
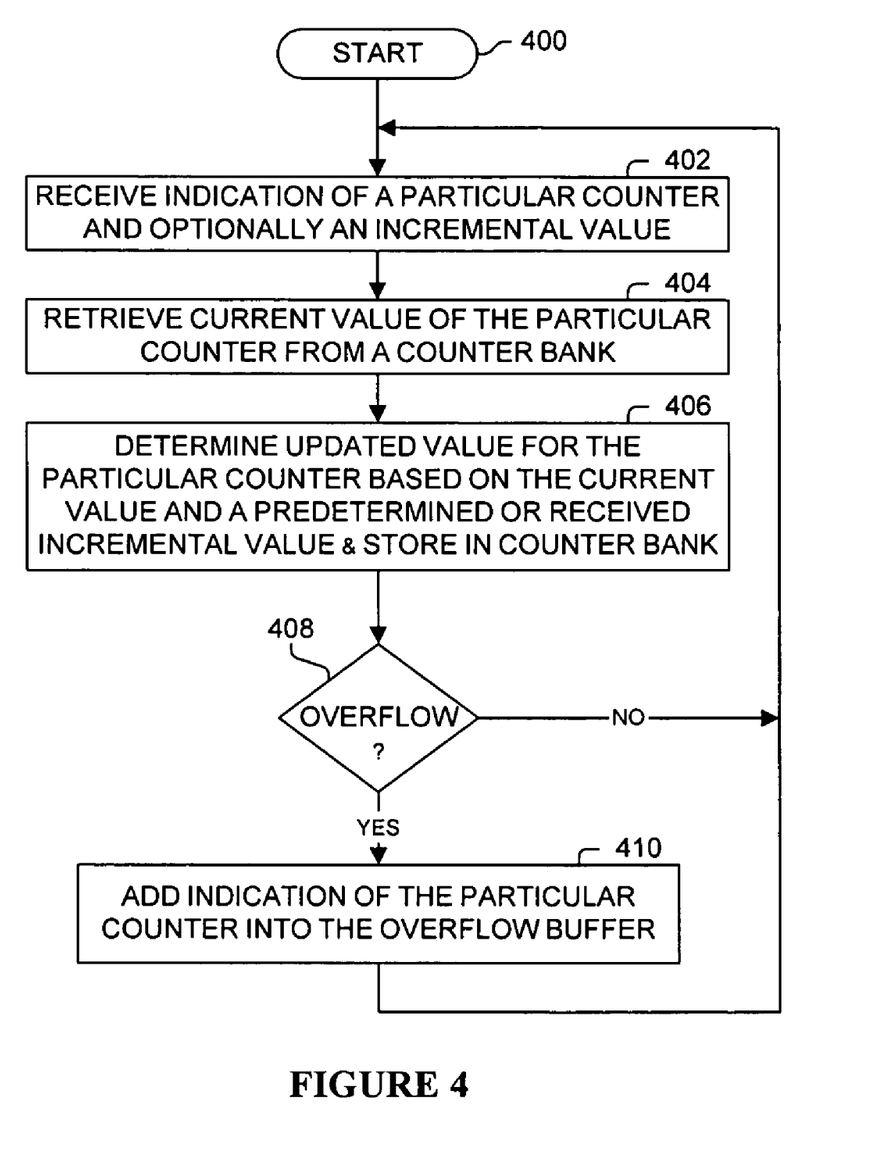
FIG. 4 is a flow diagram illustrating a process for updating counters and adding overflow indications to the overflow buffer used in one embodiment.

FIG. 4 illustrates a process for updating a counter in a counter bank used in one embodiment. Processing begins with process block 400, and proceeds to process block 402, wherein an indication of a particular counter to update is received. In one embodiment, an incremental value is also received (otherwise, the incremental value is already known, such as a constant value, a previously used value, etc.). In process block 404, the current value of the particular counter is retrieved from the counter bank. In process block 406, the updated value for the particular counter is determined based on the current value and the incremental value, and it is stored in the counter bank. As determined in process block 408, if there was an overflow condition generated in response to determining the new value for the counter, then in process block 410, an indication of the particular counter is added to the overflow buffer. Processing returns to process block 402 to update more counters.

Figure 5:
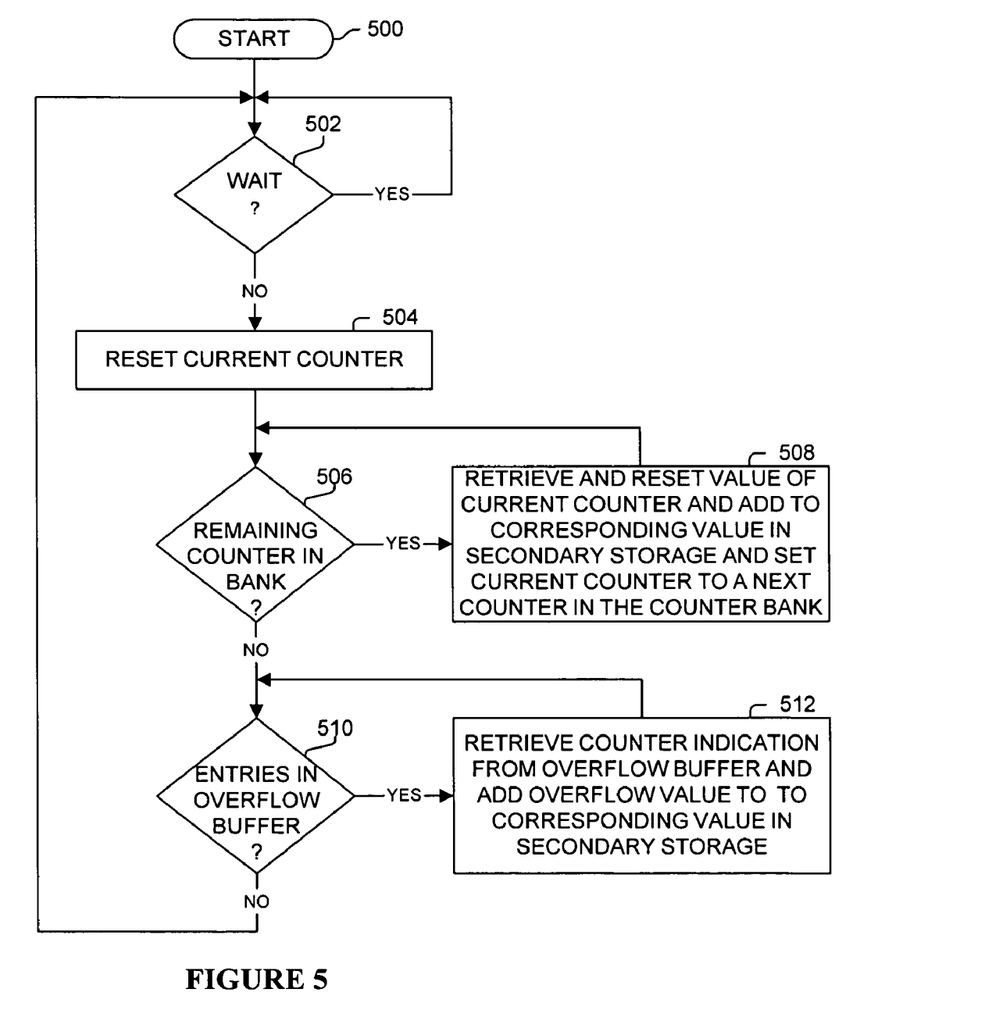
FIG. 5 is a flow diagram illustrating a process for updating secondary counters based on counters and an overflow buffer used in one embodiment.

FIG. 5 illustrates a process for updating counters in secondary storage used in one embodiment. Processing begins in process block 500, and proceeds to process block 502, wherein the processing optionally waits until it is time to begin a new update cycle, or proceeds directly to update the counters in the secondary storage. In process block 504, a current counter position variable is reset to that of the first counter in the counter bank. As determined in process block 506, while there remain counters in the counter bank to process, in process block 508, the value of the current counter is retrieved from and reset in the counter bank, with the retrieved value added to the corresponding value of the counter stored in secondary storage, and the current counter is advanced to the next counter. Then, as determined in process block 510, while there remain entries in the overflow buffer (or for some subset of the entries in one embodiment), then in process block 512, an indication of a counter is retrieved from the overflow buffer, and the value of the corresponding counter in secondary storage is updated by a value corresponding to the overflow condition. After the update cycle of the secondary storage is complete, processing returns to process block 502 to repeat another update cycle.

Figure 6A:
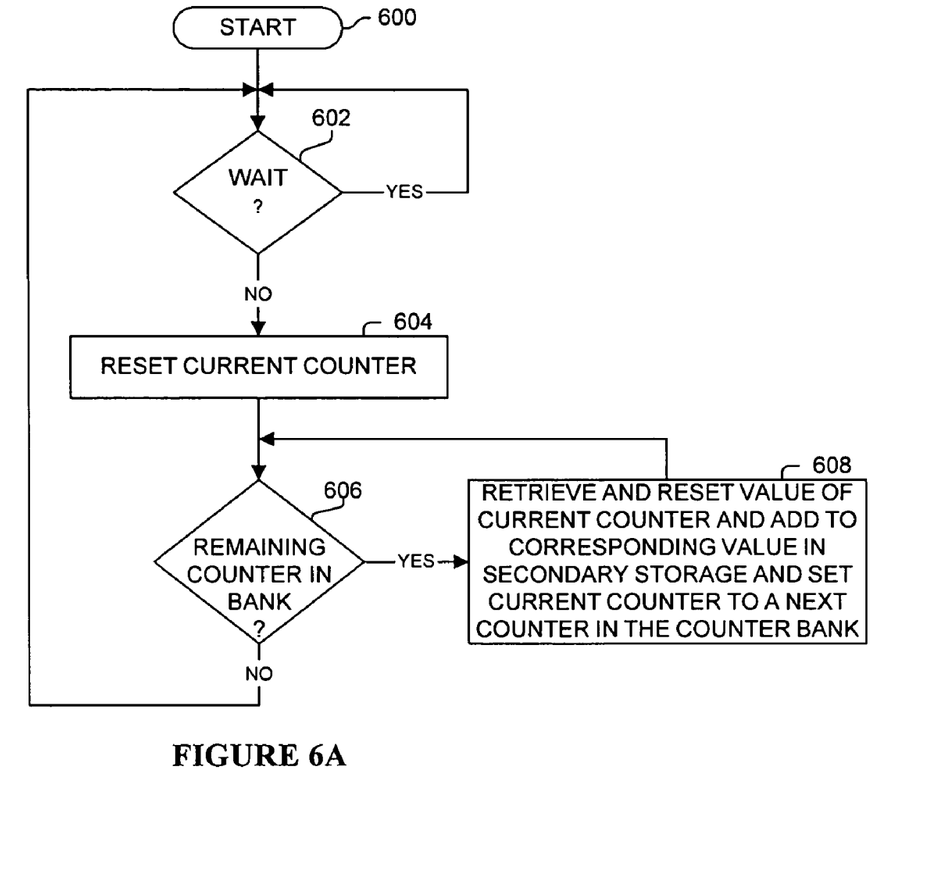
FIGS. 6A-B are flow diagrams illustrating processes for updating secondary counters based on counters and an overflow buffer used in one embodiment.
Figure 6B:
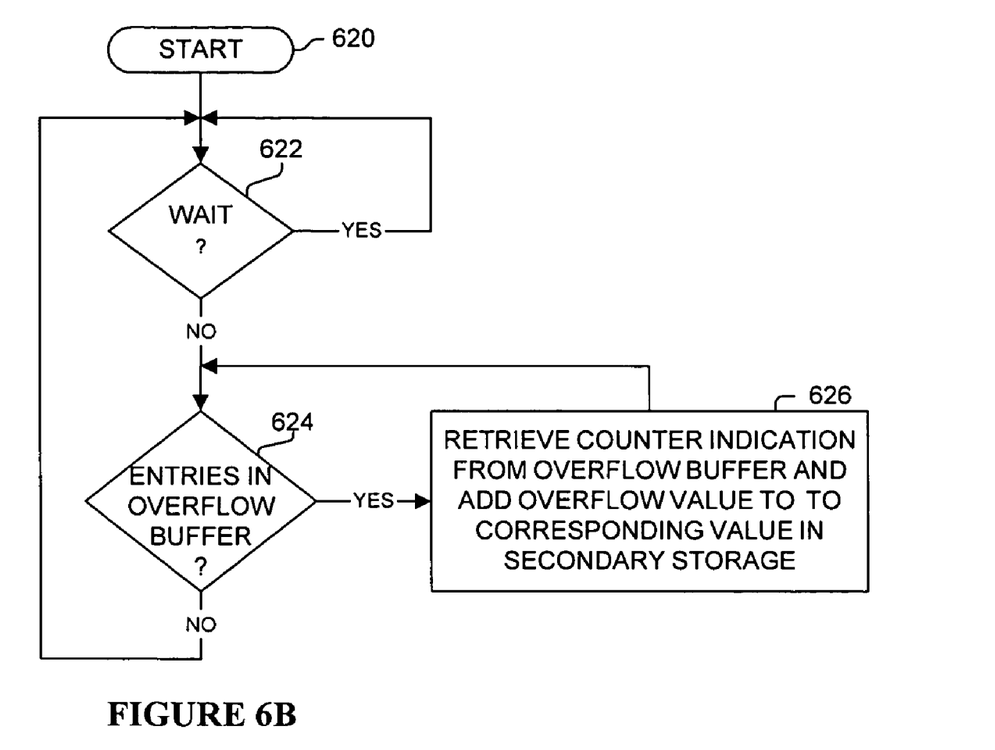

FIGS. 6A-B are flow diagrams illustrating processes for updating secondary counters based on counters and an overflow buffer used in one embodiment. These figures illustrate that the processing to visit the counters to update the secondary storage counters and the processing to update the secondary storage counters based on the entries in the overflow buffer can be independent, and may or may not run in lockstep with each other. For example, in one embodiment, the processing to visit the counters to update the secondary storage counters and the processing to update the secondary storage counters based on the entries in the overflow buffer runs the same number of times during an update cycle of the secondary counters. In one embodiment during an update cycle of the secondary counters, one update iteration of the processing illustrated in FIG. 6A (i.e., updating the secondary counters based on the counter bank counters) is performed while multiple update iterations of the processing illustrated in FIG. 6B (updating the secondary counters based on entries in the overflow buffer, if any) is performed. A smaller overflow buffer can typically be used if the overflow buffer is visited more often during a secondary counter update cycle than if it is only visited once.

Turning to FIG. 6A, processing beings with process block 600, and proceeds to process block 602, wherein the processing optionally waits until it is time to begin a new update cycle, or proceeds directly to update the counters in the secondary storage. In process block 604, a current counter position variable is reset to that of the first counter in the counter bank. As determined in process block 606, while there remain counters in the counter bank to process, in process block 608, the value of the current counter is retrieved from and reset in the counter bank, with the retrieved value added to the corresponding value of the counter stored in secondary storage, and the current counter is advanced to the next counter. Processing then returns to process block 602.

Turning to FIG. 6B, processing beings with process block 620, and proceeds to process block 622, wherein the processing optionally waits until it is time to begin a new update cycle, or proceeds directly to update the counters in the secondary storage. Then, as determined in process block 624, while there remain entries in the overflow buffer (or for some subset of the entries in one embodiment), then in process block 626, an indication of a counter is retrieved from the overflow buffer, and the value of the corresponding counter in secondary storage is updated by a value corresponding to the overflow condition. Processing then returns to process block 622.

Figure 7:
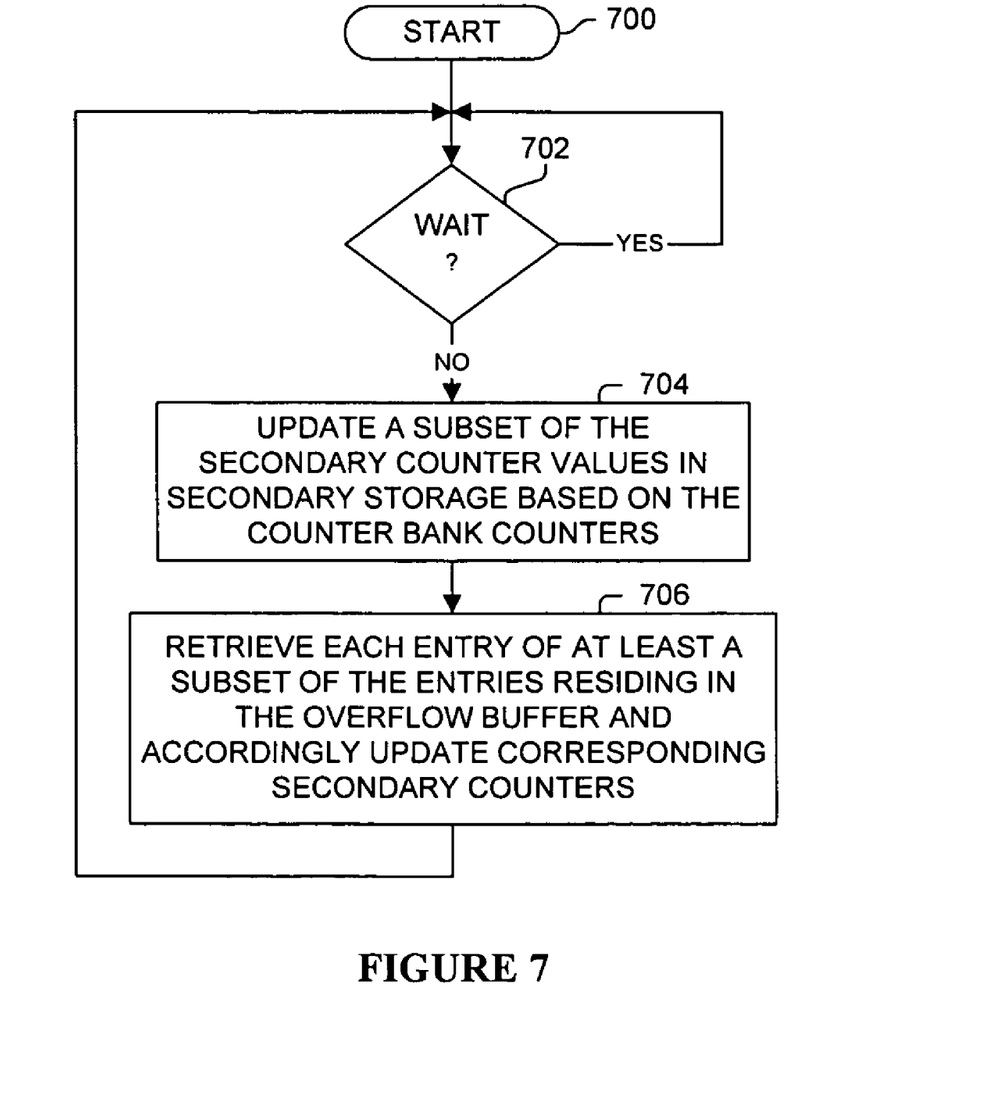
FIG. 7 is a flow diagram illustrating a process for updating secondary counters based on counters and an overflow buffer used in one embodiment.

FIG. 7 is a flow diagram illustrating a process for updating secondary counters based on counters and an overflow buffer used in one embodiment. This process illustrates that, in one embodiment, the secondary counters are updated based on: a portion of the counter bank counters, then by a portion or all of the entries in the overflow buffer, then by a next portion of the counter bank counters, and so on. Once again, this process just shows another embodiment and further illustrates the extensible nature of embodiments.

Turning to FIG. 7, processing beings with process block 700, and proceeds to process block 702, wherein the processing optionally waits until it is time to begin a new portion of the update cycle, or proceeds directly to update the secondary counters in the secondary storage. In process block 704, a subset of the secondary counters is updated based on the corresponding subset of counter bank counters. Then, in process block 706, the secondary counters are updated based at least on a subset of the entries in the overflow buffer (if there are any such entries). Processing then returns to process block 702.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An apparatus comprising:
a bank including a plurality of counters;
an overflow buffer configured to store overflow indications corresponding to the plurality of counters;
a counter update mechanism configured to update counters of the plurality of counters based on input values, and if updating a counter of said counters generates an overflow condition, adding an entry to the overflow buffer to identify the counter;
a secondary storage for maintaining secondary counter values corresponding to the plurality of counters; and
a secondary storage update mechanism configured to update said secondary counter values in the secondary storage, said updating said secondary counter values includes: (a) for each particular counter of the plurality of counters, reading and resetting a current value of said particular counter and adding said read current value, at least when non-zero, to a corresponding secondary counter value in the secondary storage; and (b) for each particular entry of at least a subset of entries currently stored in the overflow buffer if the overflow buffer is not empty, retrieving the particular entry from the overflow buffer and adding a value corresponding to the overflow condition corresponding to the particular entry to a corresponding secondary counter value in the secondary storage.

2. The apparatus of claim 1, wherein said updating the secondary counter values in the secondary storage includes repeatedly performing iterations of said (a) and said (b).

3. The apparatus of claim 2, wherein each iteration of said iterations includes an equal number of times that said (a) is performed and said (b) is performed.

4. The apparatus of claim 2, wherein each iteration of said iterations includes said (b) being performed more times than that of said (a).

5. The apparatus of claim 4, wherein said (a) is accomplished by operating on different subsets of the plurality of counters; and wherein said (b) is performed multiple times during said each iteration, each of said multiple times occurring after said operation on one of said different subsets.

6. The apparatus of claim 1, wherein each of said entries in the overflow buffer includes an index into the bank of the plurality of counters to identify one of the plurality of counters.

7. A method for maintaining counters, the method comprising:
updating a current value of a particular counter of a plurality of counters maintained in a counter bank in response to an identification of the particular counter, and if an overflow condition results, then adding an indication corresponding to the particular counter to an overflow buffer; and
updating values in a secondary storage, said values corresponding to the plurality of counters, said updating including (a) visiting each of the plurality of counters to update corresponding values in the secondary storage, and (b) retrieving one or more indications from the overflow buffer if it is not empty and updating corresponding values in the secondary storage based on said retrieved indications.

8. The method of claim 7, wherein said visiting each of the plurality of counters to update corresponding values in the secondary storage includes reading and resetting each of the plurality of counters.

9. The method of claim 7, wherein said updating corresponding values in the secondary storage based on said retrieved entries includes adding an overflow value corresponding to the overflow condition to said corresponding values in the secondary storage.

10. The method of claim 7, wherein said updating values in the secondary storage includes repeatedly performing iterations of said (a) and said (b).

11. The method of claim 10, wherein each iteration of said iterations includes an equal number of times that said (a) is performed and said (b) is performed.

12. The method of claim 10, wherein each iteration of said iterations includes said (b) being performed more times than that of said (a).

13. The method of claim 12, wherein said (a) is accomplished by operating on different subsets of the plurality of counters; and wherein said (b) is performed multiple times during said each iteration, each of said multiple times occurring after said operation on one of said different subsets.

14. An apparatus for maintaining counters, the apparatus comprising:
means for updating a current value of a particular counter of a plurality of counters maintained in a counter bank in response to an identification of the particular counter, and if an overflow condition results, then adding an indication corresponding to the particular counter to an overflow buffer; and means for updating values in a secondary storage, said values corresponding to the plurality of counters, said updating including (a) visiting each of the plurality of counters to update corresponding values in the secondary storage, and (b) retrieving one or more indications from the overflow buffer if it is not empty and updating corresponding values in the secondary storage based on said retrieved indications.

15. The apparatus of claim 14, wherein said visiting each of the plurality of counters to update corresponding values in the secondary storage includes reading and resetting each of the plurality of counters.

16. The apparatus of claim 14, wherein said updating corresponding values in the secondary storage based on said retrieved entries includes adding an overflow value corresponding to the overflow condition to said corresponding values in the secondary storage.

17. The apparatus of claim 14, wherein said updating values in the secondary storage includes repeatedly performing iterations of said (a) and said (b).

18. The apparatus of claim 17, wherein each iteration of said iterations includes an equal number of times that said (a) is performed and said (b) is performed.

19. The apparatus of claim 17, wherein each iteration of said iterations includes said (b) being performed more times than that of said (a).

20. The apparatus of claim 19, wherein said (a) is accomplished by operating on different subsets of the plurality of counters; and wherein said (b) is performed multiple times during said each iteration, each of said multiple times occurring after said operation on one of said different subsets.

21. One or more computer-readable media for storing computer-executable instructions which when executed enable a computer to perform steps, said steps comprising:

updating a current value of a particular counter of a plurality of counters maintained in a counter bank in response to an identification of the particular counter, and if an overflow condition results, then adding an indication corresponding to the particular counter to an overflow buffer; and updating values in a secondary storage, said values corresponding to the plurality of counters, said updating including (a) visiting each of the plurality of counters to update corresponding values in the secondary storage, and (b) retrieving one or more indications from the overflow buffer if it is not empty and updating corresponding values in the secondary storage based on said retrieved indications.

22. The computer-readable media of claim 21, wherein said visiting each of the plurality of counters to update corresponding values in the secondary storage includes reading and resetting each of the plurality of counters.

23. The computer-readable media of claim 21, wherein said updating corresponding values in the secondary storage based on said retrieved entries includes adding an overflow value corresponding to the overflow condition to said corresponding values in the secondary storage.

24. The computer-readable media of claim 21, wherein said updating values in the secondary storage includes repeatedly performing iterations of said (a) and said (b).

25. The computer-readable media of claim 24, wherein each iteration of said iterations includes an equal number of times that said (a) is performed and said (b) is performed.

26. The computer-readable media of claim 24, wherein each iteration of said iterations includes said (b) being performed more times than that of said (a).

27. The computer-readable media of claim 26, wherein said (a) is accomplished by operating on different subsets of the plurality of counters; and wherein said (b) is performed multiple times during said each iteration, each of said multiple times occurring after said operation on one of said different subsets.

\* \* \* \* \*